(12) United States Patent
Majhi et al.

(10) Patent No.: US 10,734,513 B2
(45) Date of Patent: Aug. 4, 2020

(54) HETEROJUNCTION TFETS EMPLOYING AN OXIDE SEMICONDUCTOR

(71) Applicant: Intel Corporation, Santa Clara, CA (US)

(72) Inventors: Prashant Majhi, San Jose, CA (US); Jack T. Kavalieros, Portland, OR (US); Elijah V. Karpov, Santa Clara, CA (US); Uday Shah, Portland, OR (US); Ravi Pillarisetty, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/768,822

(22) PCT Filed: Nov. 16, 2015

(86) PCT No.: PCT/US2015/060935
§ 371 (c)(1),
(2) Date: Apr. 16, 2018

(87) PCT Pub. No.: WO2017/086921
PCT Pub. Date: May 26, 2017

(65) Prior Publication Data
US 2018/0301551 A1 Oct. 18, 2018

(51) Int. Cl.
*H01L 29/78* (2006.01)
*H01L 29/66* (2006.01)
(Continued)

(52) U.S. Cl.
CPC ............ *H01L 29/78* (2013.01); *H01L 29/267* (2013.01); *H01L 29/66356* (2013.01); *H01L 29/66969* (2013.01); *H01L 29/7391* (2013.01)

(58) Field of Classification Search
CPC .......... H01L 29/0895; H01L 29/66742; H01L 29/786; H01L 29/78; H01L 29/267; H01L 29/66356; H01L 29/7391; H01L 29/66969
See application file for complete search history.

(56) References Cited

U.S. PATENT DOCUMENTS 8,148,718 B2\* 4/2012 Asbeck ................. H01L 29/205
257/192
2007/0178650 A1\* 8/2007 Chen ..................... H01L 29/165
438/301
(Continued)

FOREIGN PATENT DOCUMENTS

KR 20140088658 7/2014
WO 2015099744 7/2015

OTHER PUBLICATIONS

International Search Report and Written Opinion for International Patent Application No. PCT/US2015/060935, dated July 28, 2016.
(Continued)

*Primary Examiner* — Jarrett J Stark
(74) *Attorney, Agent, or Firm* — Green, Howard & Mughal LLP

(57) ABSTRACT

Heterojunction tunnel field effect transistors (hTFETs) incorporating one or more oxide semiconductor and a band offset between at least one of a channel material, a source material of a first conductivity type, and drain of a second conductivity type, complementary to the first. In some embodiments, at least one of p-type material, channel material and n-type material comprises an oxide semiconductor. In some embodiments, two or more of p-type material, channel material, and n-type material comprises an oxide semiconductor. In some n-type hTFET embodiments, all of p-type, channel, and n-type materials are oxide semiconductors with a type-II or type-III band offset between the p-type and channel material.

19 Claims, 9 Drawing Sheets

(51) Int. Cl.
  *H01L 29/739*   (2006.01)
  *H01L 29/267*   (2006.01)

(56)   References Cited

U.S. PATENT DOCUMENTS

| | | | |
|---|---|---|---|
| 2012/0045879 A1* | 2/2012 | Verhulst | B82Y 10/00 |
| | | | 438/285 |
| 2013/0221407 A1* | 8/2013 | Hou | H01L 29/66803 |
| | | | 257/192 |
| 2014/0054711 A1* | 2/2014 | Chuang | H01L 29/42356 |
| | | | 257/368 |
| 2014/0252442 A1 | 9/2014 | Chuang et al. | |
| 2014/0291616 A1 | 10/2014 | Park et al. | |
| 2016/0268401 A1* | 9/2016 | Aleksov | H01L 29/7869 |

OTHER PUBLICATIONS

Nikonov, Dmitri, "4. Tunneling FETs" Beyond CMOS computing, Nikonov 4. TFET, 39 slides.

International Preliminary Report on Patentability from PCT/US2018/060935 notified May 31, 2018, 10 pgs.

International Search Report and Written Opinion for International Patent Application No. PCT/US2015/060935, dated Jul. 28, 2016.

Varley, J.B. et al., "Ambipolar doping in SnO", Applied Physics Letters, 103, 082118 (2013), AIP Publishing LLC.

Zhu, Y. et al., "Band offset determination of mixed As/Sb type-II staggered gap heterostructure for n-channel tunnel field effect transistor application", Journal of Applied Physics, 113, 024319 (2013); doi: 10.1063/1.4775606; American Institute of Physics.

* cited by examiner

| Dep. 1st Doped Oxide 705 | 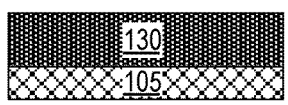 | Pattern 1st Doped Oxide 710 | 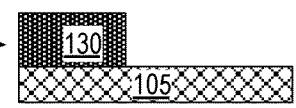 |
Deposit 2nd Oxide 715
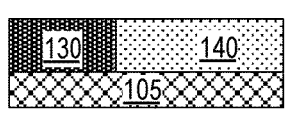 Form Gate Stack 720 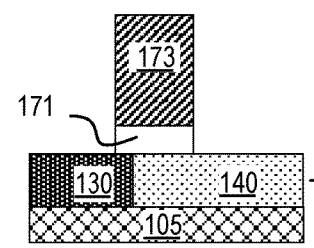
FIG. 7C  FIG. 7D
Dope 2nd Oxide 730
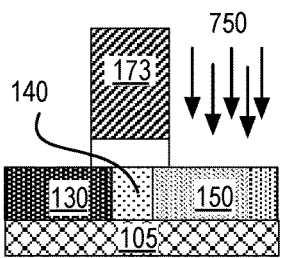 Form Contact Metallization 740 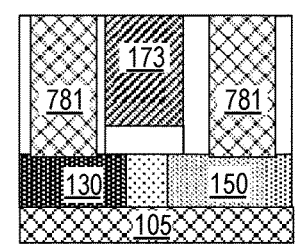
FIG. 7E  FIG. 7F

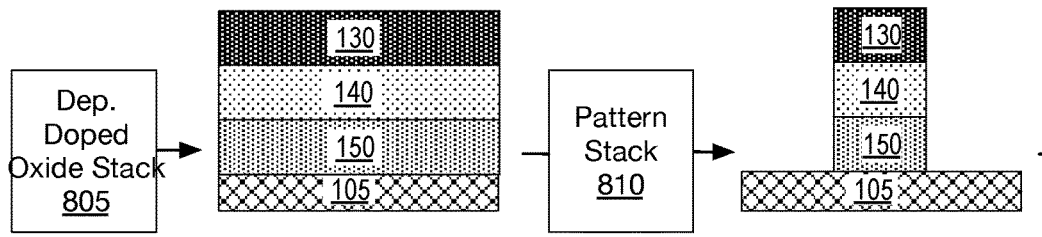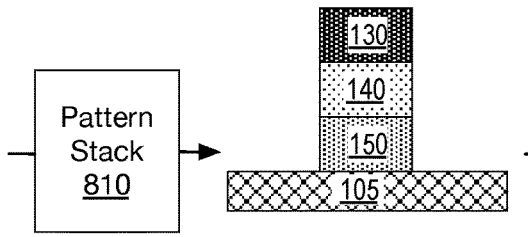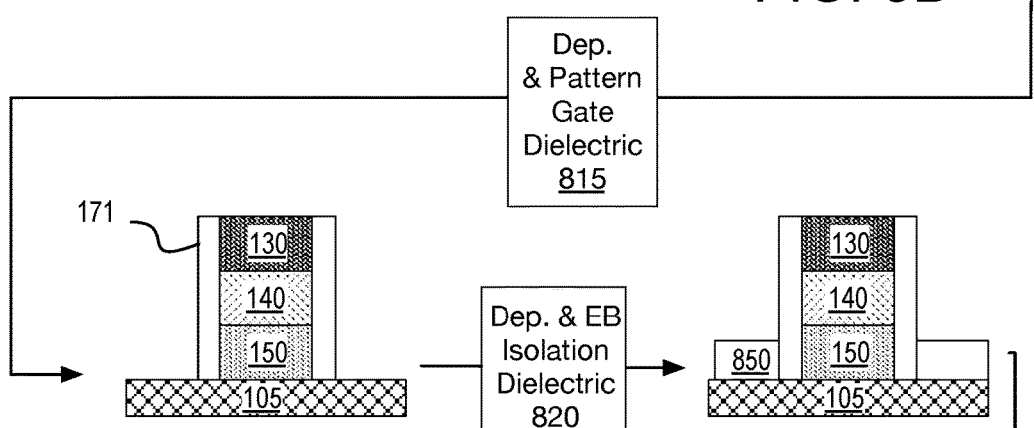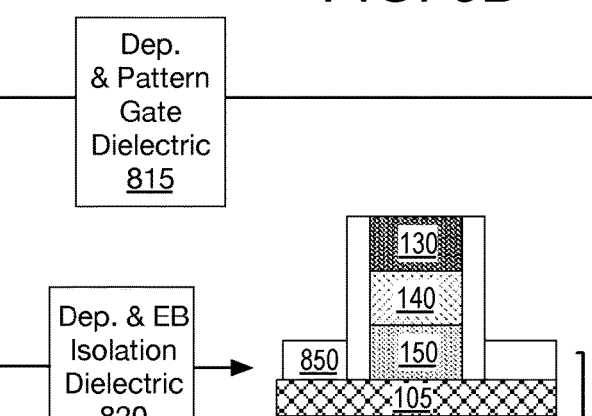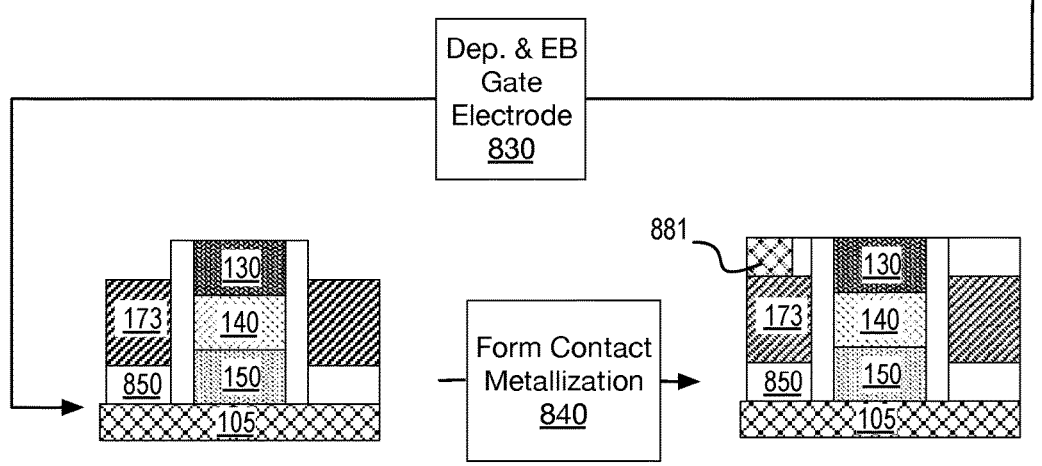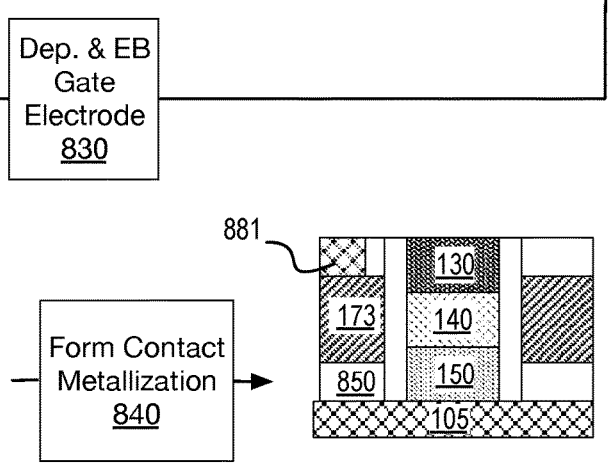

HETEROJUNCTION TFETS EMPLOYING AN OXIDE SEMICONDUCTOR

CLAIM OF PRIORITY

This Application is a National Stage Entry of, and claims priority to, PCT Application No. PCT/US15/60935, filed on 16 Nov. 2015 and titled "HETEROJUNCTION TFETS EMPLOYING AN OXIDE SEMICONDUCTOR", which is incorporated by reference in its entirety for all purposes.

BACKGROUND

A tunnel field-effect transistor (TFET) is a transistor with structure similar to a conventional metal-oxide-semiconductor FET (MOSFET) except that the source and drain terminals of a TFET are of opposite conductivity type. Hence, the common TFET device structure consists of p-i-n (p-type-intrinsic-n-type) junctions, in which the gate electrode controls the electrostatic potential of the intrinsic region. The TFET switching mechanism is by modulating quantum tunneling through a barrier associated with the p-i-n junction instead of modulating thermionic emission over a barrier as in traditional MOSFETs. The TFET is therefor a promising candidate for low energy electronics.

To date, practical TFET implementations have employed SiGe or group III-V (IUPAC groups 13-15) compound semiconductors. Unfortunately, TFETs displaying adequate performance characteristics have required high quality SiGe and/or III-V channel material, and junctions, thus far necessitating high processing temperatures (e.g., in excess of 600° C.). Such high processing temperatures are incompatible with back-end-of-line (BEOL) logic circuitry comprising active devices that are fabricated subsequent to the fabrication of front-end-of-line (FEOL) logic circuitry. Such temperatures are also incompatible with low-temperature substrates (e.g., polymers). As such, much TFET development effort is focused on supplanting conventional MOSFETs employed in frontend logic circuitry. While conventional thin-film transistors (TFT) continue to be the active device of choice for BEOL.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIGS. 7A, 7B, 7C, 7D, 7E, and 7F illustrate a method of fabricating a planar hTFET, in accordance with some embodiments;

FIGS. 8A, 8B, 8C, 8D, 8E, and 8F illustrate a method of fabricating a vertical hTFET, in accordance with some embodiments;

DETAILED DESCRIPTION

Figure 1A:
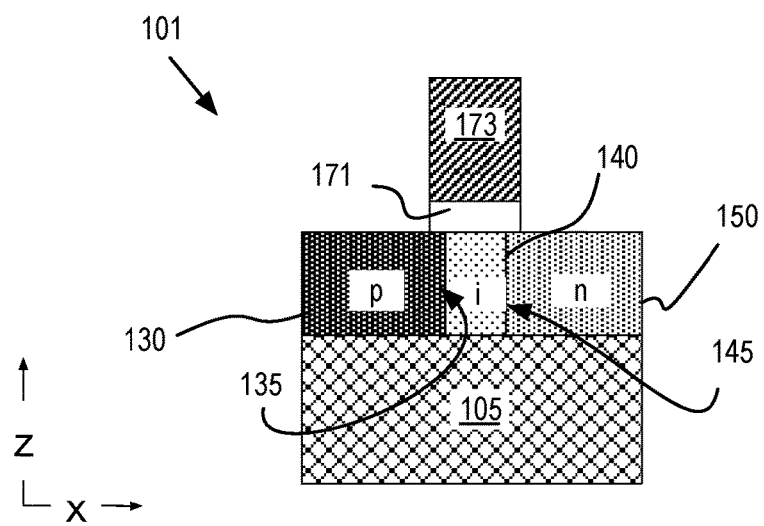
FIG. 1A is a cross-sectional view of a heterojunction TFET (hTFET), in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Figure 1B:
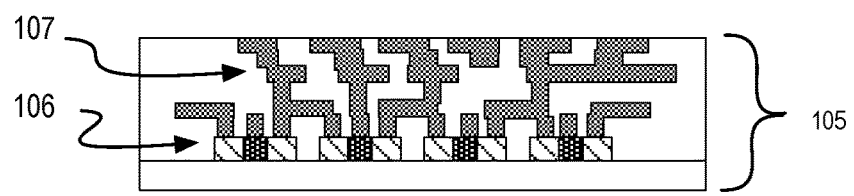
FIG. 1B is an expanded cross-section view of the substrate upon which a hTFET is disposed, in accordance with some embodiments.

Described herein are heterojunction TFETs incorporating one or more semiconducting oxide. Such hTFETs and associated fabrication techniques are compatible with backend logic circuitry therefore advantageously facilitate the integration of hTFET technology with any existing frontend logic circuitry. FIG. 1A is a cross-sectional view of a hTFET 101 disposed over a substrate 105, in accordance with some embodiments. Substrate 105 may be any known bulk substrate material, or a laminate structure. Substrate 105 may be a metal, semiconductor, or insulator, amorphous, or crystalline. In some embodiments, substrate 105 is a low-temperature substrate that degrades significantly at high temperatures (e.g., greater than 350-400° C.). For example, substrate 105 may be a polymer, such as, but not limited to polyimide, polyethylenes (e.g. PET), or polytetraflouroethylene (PTFE). In some other exemplary embodiments, substrate 105 includes FEOL logic circuitry such that hTFET 101 is a BEOL active device. FIG. 1B is an expanded cross-section view of substrate 105 upon which hTFET 101 is disposed, in accordance with some BEOL embodiments. As shown in FIG. 1B, substrate 105 includes a plurality of n-type and p-type metal-oxide-semiconductor field effect transistors (MOSFETs) 106 electrically interconnected into CMOS circuitry by a plurality of interconnect metallization levels 107. MOSFETs 106 may employ a channel of any conventional semiconductor, such as but not limited to silicon, germanium, SiGe, or III-V compounds, disposed between a pair of n-type source/drains or a pair of p-type source/drains. For embodiments in FIG. 1B, hTFET 101 provide BEOL circuitry in a 3D integrated circuit (3DIC) while MOSFETs provide the FEOL circuitry of the 3DIC. While hTFET 101 may be employed in any BEOL circuitry, in some advantageous embodiments, a plurality of hTFET 101 are employed as a pull-up, pull-down, access/pass transistors within BEOL static random access memory (SRAM) cells.

Returning to FIG. 1A, hTFET 101 includes a channel material 140 separating a p-type material 130 having p-type conductivity from an n-type material 150 having n-type conductivity. A gate dielectric material 171 separates a gate electrode material 173 from channel material 140. In some embodiments, hTFET 101 is an n-type device in which p-type material 130 functions as a source and negative charge carriers tunnel from the valence band in p-type material 130 to the conduction band in channel material 140. In some embodiments, hTFET 101 is a p-type device in which p-type material 130 functions as a drain and positive charge carriers tunnel from the conduction band in n-type material 150 to the valence band in channel material 140.

In embodiments, at least one of p-type material 130, channel material 140, and n-type material 150 is a semiconducting oxide (i.e., oxide semiconductor). In some embodiments, only one of p-type material 130, channel material 140, and n-type material 150 is an oxide semiconductor, while the other materials are non-oxide semiconductors. Many oxide semiconductors have high defect density nearer the valence band, but display good n-type electrical properties. Some oxide semiconductors have high defect density in conduction band, but display good p-type electrical properties. In some advantageous embodiments, the one oxide semiconductor is the p-type material 130. In other embodiments, the one oxide semiconductor is the channel material 140. In still other embodiment, the one oxide semiconductor is the n-type material 150. In some embodiments, two or more of p-type material 130, channel material 140, and n-type material 150 is an oxide semiconductor. In some such embodiments, both channel material 140 and n-type material 150 are oxide semiconductors. In some embodiments, the two oxide semiconductor materials include p-type material 130 and n-type material 150 and the two oxide semiconductor materials provide a type-II or type-III band offset. In still other embodiments, all of p-type material 130, channel material 140, and n-type material 150 are oxide semiconductors.

Use of oxide semiconductors may enable low temperature transistor fabrication, and display superior transistor characteristics as a result of an ability to tune the material band gap and resistivity. While such semiconductor oxides may display some level of ordering (e.g., nanocrystallinity), in some embodiments amenable to lowest processing temperatures, the oxide semiconductor is amorphous. Many oxide semiconductors have been studied, initially in the context of discrete rectifiers, and more recently in the context of transparent TFTs for display applications. Examples are metal oxides including a transition metal (e.g., IUPAC group 4-10) or post-transition metal (e.g., IUPAC groups 11-14). In advantageous embodiments, the metal oxide includes at least one of Cu, Zn, Sn, Ti, Ni, Ga, In, Sr, Cr, Co, V, or Mo. The metal oxides may be suboxides ($A_2O$) monoxides (AO), binary oxides ($AO_2$), ternary oxides ($ABO_3$), and mixtures thereof.

At least one of p-type material 130, channel material 140, and n-type material 150 is of a different material than the others, such that at least one of junctions 135, 145 is a heterojunction. In some embodiments, p-type material 130 forms a heterojunction 135 with channel material 140. In some exemplary n-TFET embodiments, source p-type material 130 has either a type-II (staggered) or type-III (broken) band offset from channel material 140, which is advantageous for higher tunneling probability and therefore higher on-state drain currents. For embodiments including such a heterojunction 135, drain n-type material 150 may form a second heterojunction with channel material 140. The presence of a second heterojunction may be advantageous, for example to suppress ambipolar behavior, or other effects (e.g., leakage) associated with high $V_{gd}$ during operation. Alternatively, n-type material 150 may have no band gap offset from channel material 140 (i.e., junction 145 is a homojunction), in which case n-type material 150 may differ in composition from channel material 140 only with respect to a higher electrically-active impurity concentration. In some p-TFET embodiments (e.g., where p-type material 130 is grounded and n-type material 150 is biased at $V_{dd}$), n-type material 150 has a composition distinct from channel material 140 with junction 145 then being a heterojunction defining tunneling probability. For such embodiments, junction 135 may likewise be a second heterojunction or a homojunction, for example where both p-type material 130 and channel material 140 are a same group IV, or III-V semiconductor.

Figure 2:
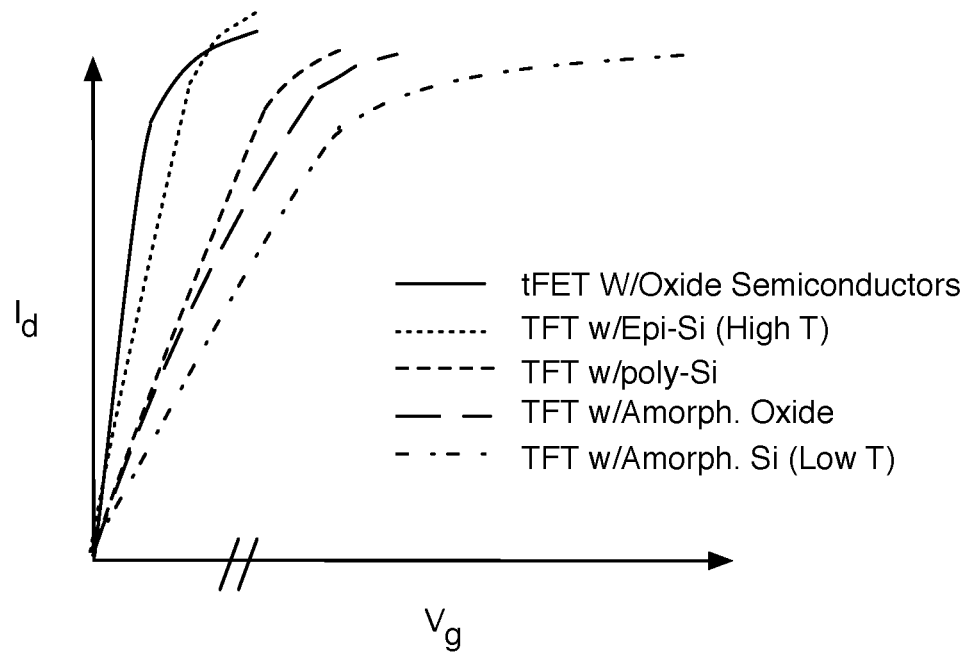
FIG. 2 is a graph comparing drive current as a function of applied gate voltage for a hTFET in accordance with some embodiments with that of conventional transistors.

FIG. 2 is a graph comparing drive current as a function of applied gate voltage for a variety of conventional transistor architectures to that of an oxide semiconductor hTFET in accordance with some embodiments. As shown, an oxide semiconductor hTFET employing one or more oxide semiconductor (solid line) has sharper turn-on characteristics than a TFT (MOSFET) employing silicon. The largest difference in turn-on is apparent relative to an amorphous silicon (α-Si) TFT, which while having a low fabrication temperature suffers from low carrier mobility and/or high on-state resistance. The oxide semiconductor hTFET in accordance with embodiments has better drive current characteristics than even an epitaxial silicon TFT, which along with requiring relatively high processing temperatures also lacks the advantage of a heterojunction band offset between the p-type material and channel material. As further illustrated in FIG. 2, a TFT employing an oxide semiconductor (of the type often employed in liquid crystal displays (LCD)) also displays significantly less desirable turn-on characteristics than the oxide semiconductor hTFET in accordance with embodiments described herein. The oxide semiconductor TFT, having a conventional MOSFET structure comprising only a single thin film material with homojunctions, and with the dopant junctions being of a same conductivity type, provides on-state conduction characteristics typical of barrier height modulation rather than barrier tunneling. Backend (e.g., displays) employing TFT technology require significant power to operate, and the performance improvement illustrated for the oxide semiconductor hTFETs described herein promises much lower power displays. Hence, embodiments herein bring together the benefit of low-order semiconductor materials formed at low processing temperatures with the benefits of quantum tunneling, as further enhanced through heterojunction engineering.

Referring back to FIG. 1, in some embodiments, one or more of p-type material 130, channel material 140, and n-type material 150 is a non-oxide semiconductor, such as, but not limited to, an elemental or alloyed group IV (IUPAC group 14) semiconductor (e.g., Si, Ge, or SiGe, GeSn, etc.) or an alloyed group III-V semiconductor (e.g., InP, InSb, InAs, InGaAs, GaAs, GaAsSb, GaSb, and alloys thereof). Whereas employing only group IV or group III-V materials to achieve the low off-state leakage and high on-state tunneling current advantages of a heterojunction hTFET may require at least one high-temperature processing operation (e.g., epitaxy, melt growth, dopant activation) incompatible with BEOL or low-temperature substrates, a heterojunction hTFET including both an oxide semiconductor and a non-oxide may be more successfully produced at low temperatures. Some non-oxide semiconductors can be formed with sufficient crystal quality with relatively low processing temperatures. For example, monocrystalline Ge, and GeSn may be formed at 300-400° C. while other group IV and group III-V materials, such as InSb, GaSb, and GaAs may also be produced at temperatures acceptable for BEOL applications (e.g., polycrystalline forms may be produced at temperatures below 400° C., and amorphous forms at even lower temperatures). One of more of these low-temperature compatible non-oxide semiconductors, when integrated into a hTFET with an oxide semiconductor may display improved power efficiency relative to conventional TFETs.

Figure 3:
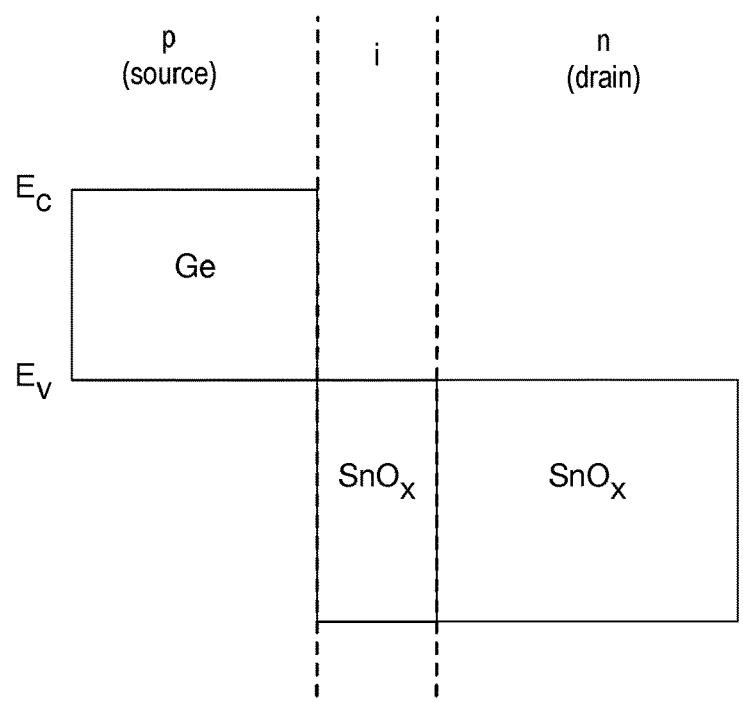
FIG. 3, 4, 5 illustrate p-i-n junctions including a non-oxide material, in accordance with some hTFET embodiments.
Figure 4:
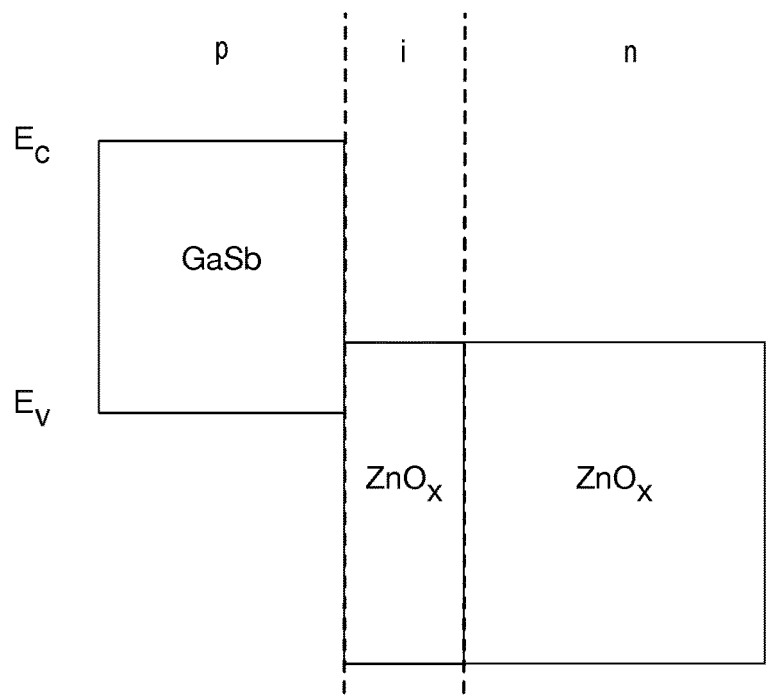
Figure 5:
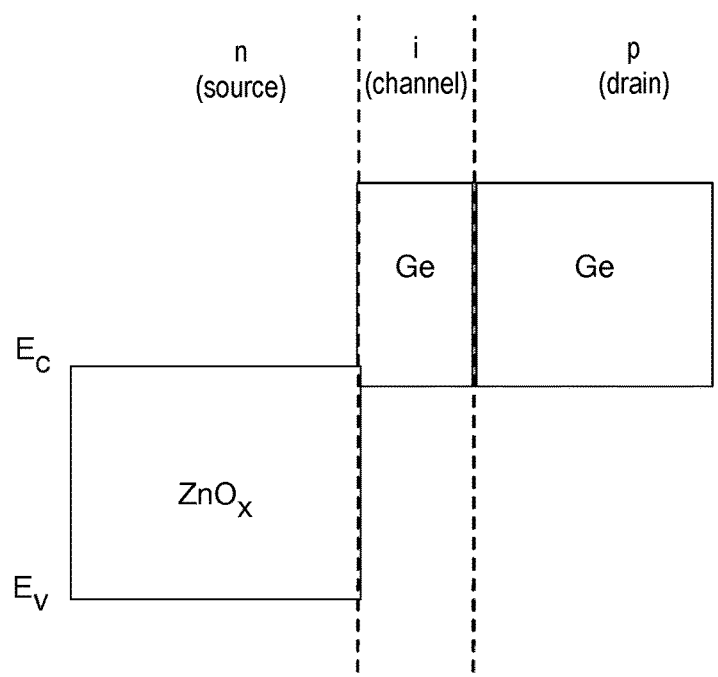

FIG. 3-5 illustrate exemplary p-i-n (n-i-p) structures including one or more a non-oxide material, in accordance with some embodiments of hTFET 101 where the p-i-n materials illustrated in FIG. 3-5 correspond to materials 130-140-150 in FIG. 1. As illustrated in FIG. 3-5, in some embodiments at least p-type material 130 is a non-oxide semiconductor. Embodiments where p-type material 130 is a group IV (e.g., Ge in FIG. 3) or group III-V (e.g., GaSb in FIG. 4) may be advantageous where it is difficult to fabricate an oxide semiconductor with a sufficient p-type conductivity, for example because of low acceptor dopant solubility and/or defect pinning near the valance band.

Referring first to FIG. 3, a p-TFET includes a Ge p-type (source) material forming a heterojunction with an intrinsic tin oxide channel material, and an n-type tin oxide (drain) material. The Ge may be doped heavily p-type (p++) for example through introduction of Boron (B), or any other impurity species known to be suitable for Ge. In some advantageous embodiments, the channel tin oxide is Tin (IV) oxide, or $SnO_2$. In other embodiments, the channel tin oxide is Tin (II) oxide (SnO) or a mixture of SnO and $SnO_2$, where x may range between 1 and 2. While the range of x may be expanded, semiconducting properties may be lost (e.g., the material becomes a pure conductor is x is to low, and a pure insulator if x is too high). In the illustrative embodiment, both the channel oxide material and the n-type oxide material have the same zinc oxide composition, resulting in a homojunction. However, the channel tin oxide is not intentionally doped and has minimal impurity dopant concentration while the drain tin oxide is impurity doped with a donor impurity, such as, but not limited to, one or more group III or group V element (e.g., In, Sb), and/or elemental hydrogen (H).

Tin oxide is a suitable channel material for an n-TFET where the gate stack (e.g., gate dielectric 171 and gate electrode 173 in FIG. 1A) is able to modulate the tin oxide between intrinsic and n-type material. For oxide semiconductor channel materials, Fermi level should not be so heavily pinned p-type/n-type that it can't be modulated through the gate electrode field. The inventors have found tin oxide can be modulated through the field effect to control tunneling current if an interface of suitable quality is formed with the gate dielectric. In some exemplary tin oxide embodiments, gate dielectric 171 comprises a high-k dielectric having a bulk relative dielectric constant greater than at least 9. The gate dielectric may include one or more material layers. In some such embodiments, the high-k gate dielectric includes at least one $Al_2O_3$, $HfO_2$, or $HfAlO_x$ in direct contact with the tin oxide. Silicates such as $HfSiO_x$ or $TaSiO_x$ may also be suitable for either direct contact with tin oxide or with a bottom interface layer of the gate dielectric. The inventors have found $HfO_2$ to give better control over tunneling current with tin oxide embodiments than alternatives such as $Al_2O_3$. However, both $Al_2O_3$, $HfO_2$ have been found to display superior results to a conventional low-k gate dielectric (e.g., $SiO_2$). One or more material providing a suitable work function may be employed as the gate electrode. In some advantageous embodiments, the oxide semiconductor hTFET includes a metal gate electrode. The gate electrode metal advantageously has a work function below 5 eV and may include an elemental metal layer, a metal alloy layer, or laminate structure of either or both. In some embodiments the gate electrode is a metal nitride, such as TiN (e.g., 4.0-4.7 eV). The gate electrode may also comprise Al (e.g., TiAlN). Other alloy constituents may also be employed in the gate electrode, such as, but not limited to C, Ta, W, Pt, and Sn.

While FIG. 3 illustrates one exemplary n-TFET employing an oxide semiconductor material providing a type-III band offset with the source, FIG. 4 illustrates an exemplary n-TFET employing an oxide semiconductor material providing a type-II band offset with the source. In the example illustrated by FIG. 4, a p-type source material of GaSb form a heterojunction with an intrinsic zinc oxide channel material, and an n-type zinc oxide (drain) material. GaSb may be readily doped p-type using known techniques. Although GaSb of high crystalline quality may require high substrate temperatures in excess of 400° C. (e.g., 500° C.), polycrystalline GaSb embodiments may be formed, for example by liquid phase epitaxy (LPE) at temperatures below 400° C. In some advantageous embodiments, the channel zinc oxide is Zn(II) oxide, or ZnO. In other embodiments, the channel zinc oxide is zinc peroxide ($ZnO_2$) or a mixture of ZnO and $ZnO_2$, where x may range between 1 and 2. In the illustrative embodiment, both the channel oxide material and the n-type oxide material have the same zinc oxide composition. The channel zinc oxide is not intentionally doped and has minimal impurity dopant concentration. The drain zinc oxide is impurity doped with a donor impurity, such as, but not limited to, one or more group III element (e.g., Al, In, Ga), and or elemental hydrogen (H).

Zinc oxide is a suitable channel material for an n-TFET where the gate stack (e.g., gate dielectric 171 and gate electrode 173 in FIG. 1A) is able to modulate the oxide semiconductor between intrinsic and n-type material. The inventors have found zinc oxide can be modulated through the field effect if an interface of suitable quality is formed. In some exemplary zinc oxide embodiments, gate dielectric 171 comprises a high-k dielectric having a bulk relative dielectric constant greater than at least 9. The gate dielectric may include one or more material layers. In some such embodiments, the high-k gate dielectric includes at least one $Al_2O_3$, $HfO_2$, or $HfAlO_x$ in direct contact with the zinc oxide. Silicates such as $HfSiO_x$ or $TaSiO_x$ may also be suitable for either direct contact with zinc oxide or with a bottom interface layer of the gate dielectric. The inventors have found $HfO_2$ to give better control over tunneling current with zinc oxide embodiments than alternatives such as $Al_2O_3$. However, both $Al_2O_3$, $HfO_2$ have been found to display superior results to a conventional low-k gate dielectric (e.g., $SiO_2$). One or more material providing a suitable work function may be employed for the gate electrode material. In some advantageous embodiments, the gate electrode is metal with a work function below 5 eV. The metal gate electrode may include an elemental metal layer, a metal alloy layer, or laminate structure of either or both. In some embodiments the gate electrode is a metal nitride, such as TiN (e.g., 4.0-4.7 eV). The gate electrode may also comprise Al (e.g., TiAlN). Other alloy constituents may also be employed, such as, but not limited to C, Ta, W, Pt, and Zn.

Referring back to FIG. 1, in some embodiments where only one of p-type material 130, channel material 140, and n-type material 150 is an oxide semiconductor, the other two materials are elemental or alloyed non-oxide semiconductors. For such embodiments, the non-oxide semiconductor materials may be the same or different, for example providing a heterojunction with a type-II or type-III band offset.

FIG. 5 illustrates an exemplary p-TFET employing an n-type oxide semiconductor material. p-TFETs are advantageous for implementing, along with n-TFETs, complementary logic suitable for BEOL or low-temperature substrates. For p-TFET embodiments herein, any oxide semiconductor known to have sufficient donor impurity solubility may be employed. In the exemplary embodiment, the n-type source material is zinc oxide is Zn(II) oxide, or ZnO. In other embodiments, the n-type zinc oxide is zinc peroxide ($ZnO_2$) or a mixture of ZnO and $ZnO_2$, where x may range between 1 and 2. The n-type zinc oxide is impurity doped with a donor impurity, such as, but not limited to, one or more group III element (e.g., Al, In, Ga), and/or elemental hydrogen (H). Other oxide materials know to have suitable n-type conductivity, such as, but not limited to, titanium oxide ($TiO_x$), $SnO_x$, and $ZnO_x$ may substitute for zinc oxide as the source in an oxide p-TFET. While a p-TFET may employ an intrinsic oxide semiconductor as a channel material, the channel material and/or drain material may also comprise a group IV elemental or alloy semiconductor, or group III-V alloy semiconductor. The non-oxide materials may be monocrystalline, polycrystalline, or amorphous. Non-oxide channel and drain embodiments may facilitate a high acceptor impurity in the drain and also good channel control of tunneling current and/or low tunneling effective mass. The non-oxide materials employed in the p-TFET ideally have relatively low formation temperatures, ensuring that the mixed oxide/non-oxide p-i-n structure can be implemented in BEOL/low temperature applications. In the embodiment illustrated in FIG. 5, the channel and p-type drain materials have the same non-oxide semiconductor composition. For the exemplary Ge embodiment illustrated, the band offset with zinc oxide may be either type-II or type-III. For an alternate embodiment with InSb replacing the Ge in FIG. 5, the band offset is type-III. P-type TFETs may also employ a non-oxide semiconductor for the n-type source. In one exemplary embodiment, an InAs source forms a heterojunction with an oxide semiconductor channel material, such as, but not limited to, $ZnO_x$ or $SnO_x$. The p-type drain may be a doped form of the zinc oxide (e.g., IZO) or tin oxide (e.g., ITO).

For non-oxide channel materials, gate dielectric 171 (FIG. 1) may be any know to be suitable for gating a non-oxide hTFET employing the same channel material (e.g., Ge). In some embodiments, the gate dielectric comprises a high-k dielectric having a bulk relative dielectric constant greater than at least 9. The gate dielectric may include one or more material layers. In some such embodiments, the high-k gate dielectric includes at least one $Al_2O_3$, $HfO_2$, or $HfAlO_x$ in direct contact with the non-oxide channel semiconductor. Silicates such as $HfSiO_x$ or $TaSiO_x$ may also be suitable for either direct contact with the semiconductor or with a bottom interface layer of the gate dielectric. The inventors have found $Al_2O_3$ to give better control over tunneling current with Ge channels than alternatives such as $HfO_2$.

Figure 6A:
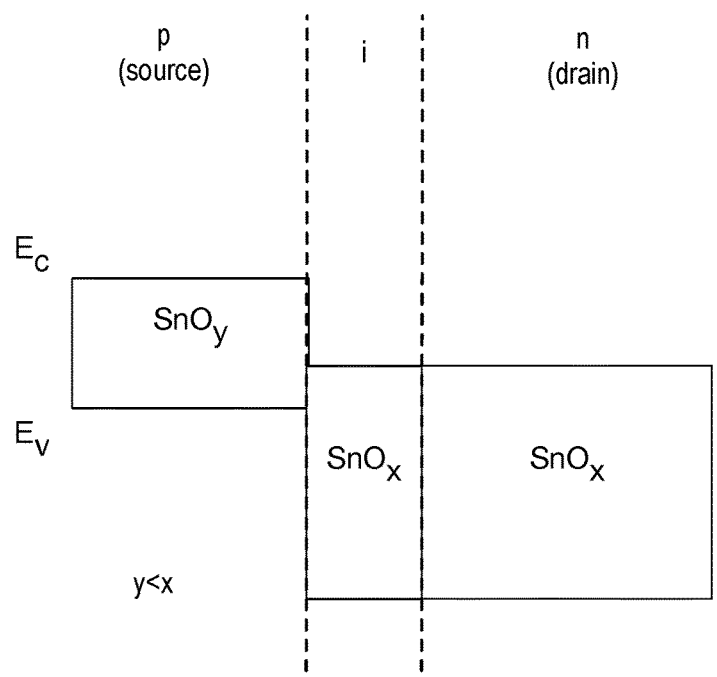
FIG. 6A, 6B, 6C illustrate p-i-n junctions with only oxide semiconductor materials, in accordance with some hTFET embodiments.
Figure 6B:
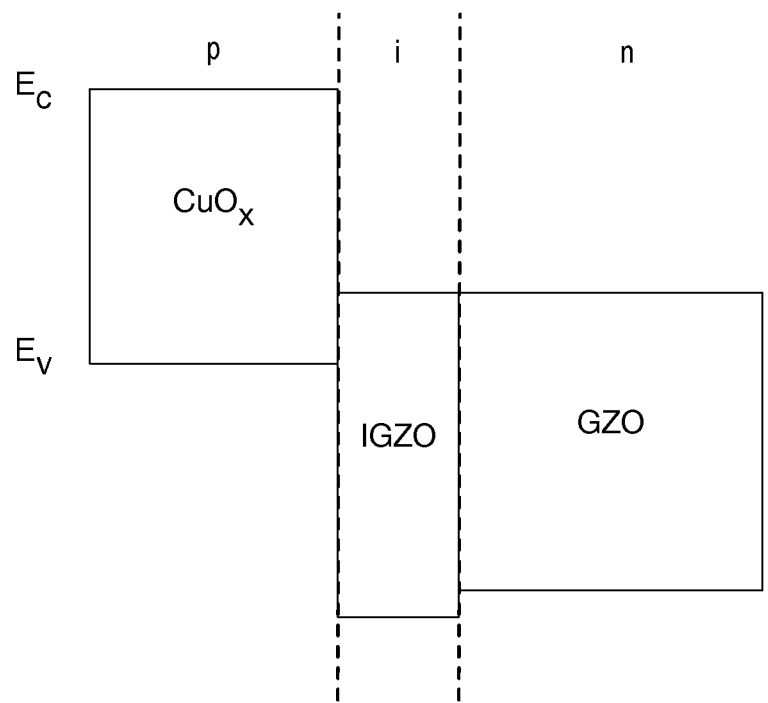
Figure 6C:
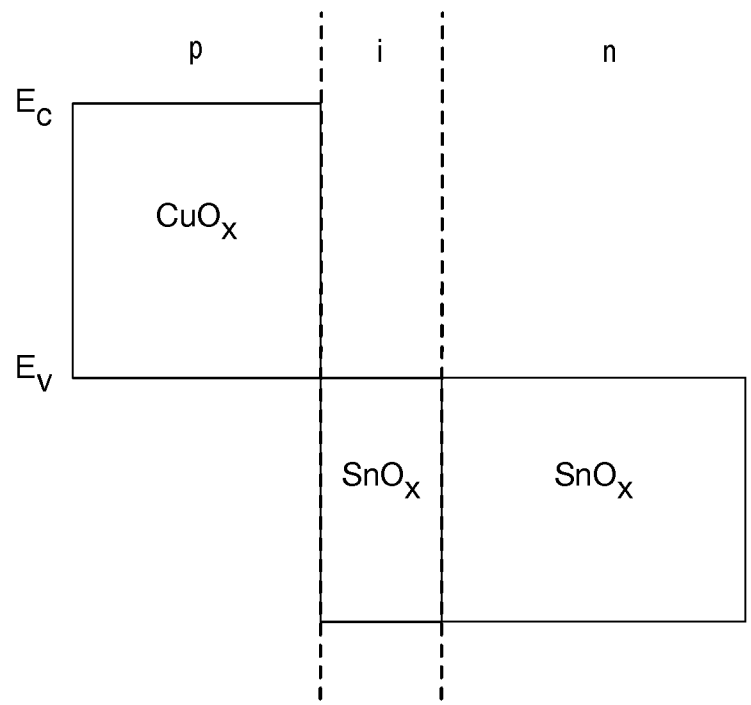

FIG. 6A, 6B, 6C illustrate exemplary p-i-n junctions formed with only oxide semiconductor materials, in accordance with some embodiments of hTFET 101 where the p-i-n materials illustrated in FIG. 6A-6C correspond to materials 130-140-150 in FIG. 1. In some exemplary embodiments, the oxide semiconductor materials selected for the source and channel provide a type-II or type-III band offset. FIG. 6A illustrates one exemplary embodiment where two oxides of one transition metal are employed for the source and channel materials. In one exemplary embodiment, p-type source material is $SnO_y$ while channel material is $SnO_x$, where y<x. In one such embodiment, an SnO p-type source forms a junction with $SnO_x$, where x>1 (e.g., $SnO_2$). N-type material may also be $SnO_x$, where x>1. As for the hTFET architecture illustrated in FIG. 3, the channel zinc oxide may not be intentionally doped and have minimal impurity dopant concentration, while the drain zinc oxide is impurity doped with a donor impurity, such as, but not limited to, one or more group III or group V element (e.g., Al, In, Ga, Sb), and/or elemental hydrogen (H).

Some exemplary zinc oxide TFETs including the p-i-n structure illustrated in FIG. 6A further include a high-k gate dielectric having a bulk relative dielectric constant greater than at least 9. The gate dielectric may include one or more material layers. In some such embodiments, the high-k gate dielectric includes at least one $Al_2O_3$, $HfO_2$, or $HfAlO_x$ in direct contact with the zinc oxide. Silicates such as $HfSiO_x$ or $TaSiO_x$ may also be suitable for either direct contact with zinc oxide or with a bottom interface layer of the gate dielectric. The inventors have found $HfO_2$ to give better control over tunneling current with zinc oxide embodiments than alternatives such as $Al_2O_3$. However, both $Al_2O_3$, $HfO_2$ have been found to display superior results to a conventional low-k gate dielectric (e.g., $SiO_2$). One or more gate material providing a suitable work function may be employed for the gate electrode. In some advantageous embodiments, the gate electrode is metal having a work function below 5 eV. A metal gate electrode may include an elemental metal layer, a metal alloy layer, or laminate structure of either or both. In some embodiments the gate electrode is a metal nitride, such as TiN (e.g., 4.0-4.7 eV). The metal nitride gate electrode may also comprise Al (e.g., TiAlN). Other alloy constituents may also be employed, such as, but not limited to C, Ta, W, Pt, and Zn.

FIG. 6B illustrates another n-TFET embodiment where the p-type oxide semiconductor is $CuO_x$. Other exemplary p-type oxide semiconductors (e.g., including NiO and SnO) may substitute for $CuO_x$ in the system illustrated in FIG. 6B. In some $CuO_x$ embodiments, the p-type material is Cu(I) oxide, or $Cu_2O$. In other embodiments, the p-type material is Cu(II) oxide (CuO) or a mixture of CuO and $Cu_2O$, where x may range between 0.5 and 1. In this exemplary system, $CuO_x$ forms a heterojunction with a channel material of $InGaO_3(ZnO)_5$, often referred to a simply IGZO. IGZO has a type-II band offset from CuO. In the exemplary embodiment illustrated in FIG. 6B, the n-type material is Ga-doped zinc oxide (GZO). The n-type material may be doped by another group III elements, such as, but not limited to Al (AZO). In some alternative embodiments, IGZO may also be employed as the n-type material in the TFET.

The inventors have found IGZO can be adequately modulated through the field effect to control tunneling current if an interface of suitable quality is formed with the gate dielectric. In some exemplary IGZO embodiments, the gate dielectric comprises a high-k dielectric having a bulk relative dielectric constant greater than at least 9. The gate dielectric may include one or more material layers. In some such embodiments, the high-k gate dielectric includes at least one $Al_2O_3$, $HfO_2$, or $HfAlO_x$ in direct contact with the IGZO. Silicates such as $HfSiO_x$ or $TaSiO_x$ may also be suitable for either direct contact with IGZO, or with a bottom interface layer of the gate dielectric. The inventors have found $HfO_2$ to give better control over tunneling current with IGZO embodiments than alternatives such as $Al_2O_3$. However, both $Al_2O_3$, $HfO_2$ have been found to display superior results to a conventional low-k gate dielectric (e.g., $SiO_2$). One or more gate material providing a suitable work function may be employed for the gate electrode. In some advantageous embodiments, the gate electrode is a metal having a work function below 5 eV. A metal gate electrode may include an elemental metal layer, a metal alloy layer, or laminate structure of either or both. In some embodiments the gate electrode is a metal nitride, such as TiN (e.g., 4.0-4.7 eV). The metal nitride may also comprise Al (e.g., TiAlN). Other alloy constituents may also be employed, such as, but not limited to C, Ta, W, Pt, and Zn.

FIG. 6C illustrates another n-TFET embodiment where the p-type oxide in the p-i-n structure is $CuO_x$. In this exemplary embodiment, the $CuO_x$ forms a heterojunction with tin oxide ($SnO_x$) to provide a type-III band offset. Any of the intrinsic and n-type material $SnO_x$ materials described above in the context of FIG. 3 or 6A may be employed in the $CuO_x$-based p-i-n structure illustrated in FIG. 6C. Likewise, any of the gate dielectric and gate electrode materials described above in the context of FIG. 3 or 6A may be employed in the $CuO_x$-based p-i-n structure illustrated in FIG. 6C.

FIGS. 7A, 7B, 7C, 7D, 7E, and 7F illustrate a method 701 for fabricating a planar hTFET, in accordance with some embodiments. While method 701 illustrates an exemplary method for forming a hTFET employing only oxide semiconductors, a similar technique may be employed to form a hTFET including both oxide and non-oxide semiconductors.

Method 701 begins with depositing a first oxide semiconductor doped with an acceptor impurity at operation 705 to form a blanket film of p-type material 130 over substrate 105, as illustrated in FIG. 7A. For example, $CuO_x$ with acceptor impurities may be deposited at operation 705. The deposition technique may be any known to be suitable for the oxide semiconductor composition, such as, but not limited to, physical vapor deposition (e.g., RF magnetron or DC sputtering) or pulsed laser deposition (PLD). In some embodiments, the substrate temperature is maintained below 400° C., and advantageously below 250° C. during deposition operation 705. At operation 710, the first oxide semiconductor is patterned to form a sidewall in p-type material 130, as illustrated in FIG. 7B. Patterning operation 710 may employ any known technique, such as, but not limited to, lithographic mask printing and subtractive film etching.

At operation 715 a second oxide semiconductor is deposited to form channel material 140 in direct contact with a sidewall of p-type material 130, as illustrated in FIG. 7C. In some embodiments, a selective deposition process is employed at operation 715 to form channel material only on exposed surfaces of substrate 105. For example, an epitaxial process may be employed to form Ge over surfaces of substrate 105 at a rate greater than a rate of Ge deposition on p-type material 130. In alternative embodiments, a non-selective (blanket) deposition process is employed at operation 715 forming channel material both adjacent to p-type material 130 and over p-type material 130. Operation 715 may then further entail a planarizing (e.g., polishing) process so that a top surface of both p-type material 130 is planar with a top surface of channel material 140. For example, intrinsic IGZO may be deposited and planarized with a top surface of $CuO_x$ at operation 715. In some embodiments, the substrate temperature is maintained below 400° C., and advantageously below 250° C. during deposition operation 715.

Method 701 continues at operation 720 where a gate stack is formed. Any deposition process known to be suitable for a particular gate dielectric may be employed at operation 720, such as but not limited to, atomic layer deposition (ALD), and chemical vapor deposition (CVD). In one exemplary embodiment, $HfO_2$ is deposited by ALD non-selectively over both p-type material 130 and channel material 140. A gate metal may be further deposited on the gate dielectric using any known technique. The gate metal and gate dielectric may then be patterned, for example with lithographic mask printing and subtractive etching, to arrive at the gate stack illustrated in FIG. 7D comprising gate dielectric 171 and gate metal 173. Patterning at operation 720 aligns an edge of the gate stack to overlap p-type material 130 with a remainder of the gate stack disposed over channel material 140. In some embodiments, the substrate temperature is maintained below 400° C., and advantageously below 250° C. during deposition operation 720.

With the gate stack in place, an exposed portion of channel material 140 is doped with a donor impurity at operation 730. The self-aligned doping at operation 750 may be by any known technique, such as, but not limited to implantation of ions 750, to form n-type material 150 illustrated in FIG. 7E. For example, IGZO may be doped with hydrogen to form n-type material 150. In some embodiments, the substrate temperature is maintained below 400° C., and advantageously below 250° C. during deposition operation 730.

With the p-i-n structure aligned with the gate stack, method 701 may by completed with any known contact metallization at operation 740 to arrive at the metallized hTFET illustrated in FIG. 7F. Contact metallization 781 deposited at operation 740 may be planarized with a top surface of gate metal 173 to arrive at the planer hTFET structure ready for interconnection into logic circuitry.

FIGS. 8A, 8B, 8C, 8D, 8E, and 8F illustrate a method 801 for fabricating a vertical hTFET, in accordance with some embodiments. While method 801 illustrates an exemplary method for forming a hTFET employing only oxide semiconductors, a similar technique may be employed to form a hTFET including both oxide and non-oxide semiconductors.

Method 801 begins with depositing a p-i-n material stack including one or more oxide semiconductors at operation 805. In the example illustrated in FIG. 8A, a first oxide semiconductor (e.g., IGZO) doped with a donor impurity is deposited on a surface of substrate 105, followed by an intrinsic oxide semiconductor (e.g., IGZO) deposited on a surface of n-type material 150, followed by another oxide semiconductor (e.g., $CuO_x$) doped with an acceptor impurity on a surface of channel material 140. Any known deposition technique(s) may be employed at operation 805, such as, but not limited to, physical vapor deposition (e.g., RF magnetron or DC sputtering) or pulsed laser deposition (PLD). In some embodiments, the substrate temperature is maintained below 400° C., and advantageously below 250° C. during deposition operation 805.

At operation 810, the semiconductor oxide stack is patterned to form a sidewall in each of p-type material 130, channel material 140, and n-type material 150, as illustrated in FIG. 8B. Patterning operation 810 may employ any known technique, such as, but not limited to, lithographic mask printing and subtractive film etching. A gate dielectric is then deposited over the semiconductor oxide stack sidewall. Any deposition process known to be suitable for a particular gate dielectric may be employed at operation 815, such as but not limited to, atomic layer deposition (ALD), and chemical vapor deposition (CVD). In one exemplary embodiment, $HfO_2$ is deposited by ALD non-selectively. The gate dielectric may be anistropically etched, for example without an overlying mask to retain gate dielectric 171 self-aligned to the semiconductor oxide stack. At operation 820, an isolation dielectric 850 is deposited over exposed regions of substrate 105 and etched back, as illustrated in FIG. 8D. At operation 830, gate metal 173 is deposited over gate dielectric 171 and isolation dielectric 850 using any known deposition and patterning techniques. In some embodiments, the substrate temperature is maintained below 400° C., and advantageously below 250° C. during deposition operation 830. Method 801 may then be completed with any known contact metallization at operation 840 to arrive at the metallized hTFET illustrated in FIG. 8F. Contact metallization 881 deposited at operation 840 may be planarized with a top surface of p-type material 130 in preparation for interconnection into logic circuitry (n-type material 150 may be interconnected through substrate 105).

Figure 9:
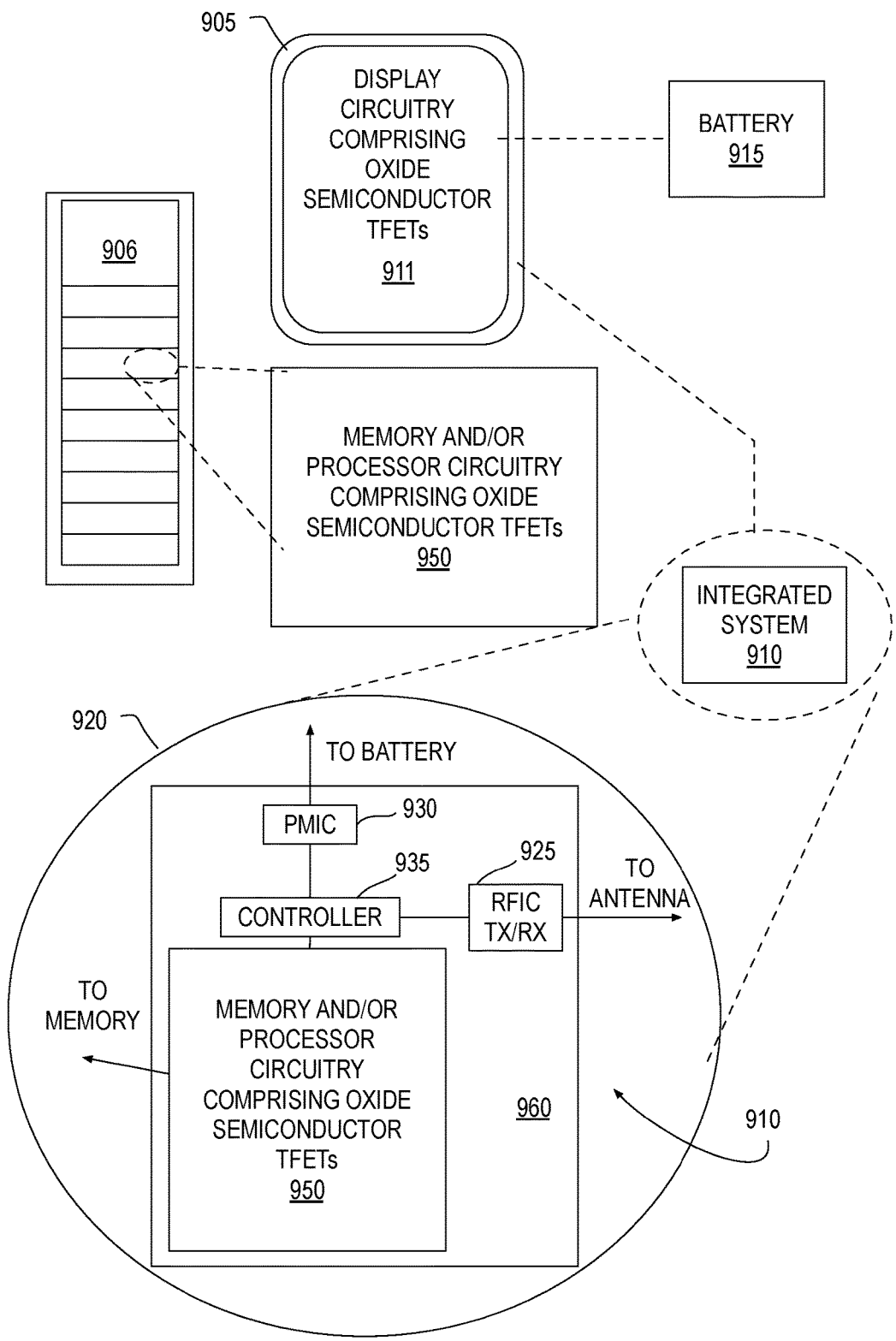
FIG. 9 is a schematic illustrating a mobile computing platform and a data server machine employing hTFET arrays, in accordance with embodiments of the present invention.

FIG. 9 illustrates a system in which a mobile computing platform 905 and/or a data server machine 906 employs a hTFET including one or more semiconductor oxide, for example in accordance with embodiments described above. The server machine 906 may be any commercial server, for example including any number of high-performance computing platforms disposed within a rack and networked together for electronic data processing, which in the exemplary embodiment includes a packaged device 950.

The mobile computing platform 905 may be any portable device configured for each of electronic data display, electronic data processing, wireless electronic data transmission, or the like. For example, the mobile computing platform 905 may be any of a tablet, a smart phone, laptop computer, etc., and may include a display screen (e.g., a capacitive, inductive, resistive, or optical touchscreen) 911, a chip-level or package-level integrated system 910, and a battery 915. In some embodiments, display screen 911 includes an array of TFETs, each including one or more semiconductor oxide, for example in accordance with embodiments described above.

Whether disposed within an integrated system 910 illustrated in the expanded view 920, or as a stand-alone packaged device within the server machine 906, an SOC 960 includes hTFETs, each including one or more semiconductor oxide, for example in accordance with embodiments described above. SOC 960 may further include a memory circuitry and/or a processor circuitry 940 (e.g., SRAM, a microprocessor, a multi-core microprocessor, graphics processor, etc.). In some embodiments, the SRAM is embedded as BEOL circuitry employing hTFETs including one or more semiconductor oxide, for example in accordance with embodiments described above. Any of controller 935, PMIC 930, or RF (radio frequency) integrated circuitry (RFIC) 925 may include embedded hTFETs, each including one or more semiconductor oxide, for example in accordance with embodiments described above. For example, controller 935, PMIC 930, or RF (radio frequency) integrated circuitry (RFIC) 925 may include both FEOL CMOS FET circuitry (with Si, III-V, or GaN channels) and BEOL hTFET circuitry with one or more semiconductor oxide.

As further illustrated, in the exemplary embodiment, RFIC 925 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these SoC modules may be integrated onto separate ICs coupled to a package substrate, interposer, or board.

Figure 10:
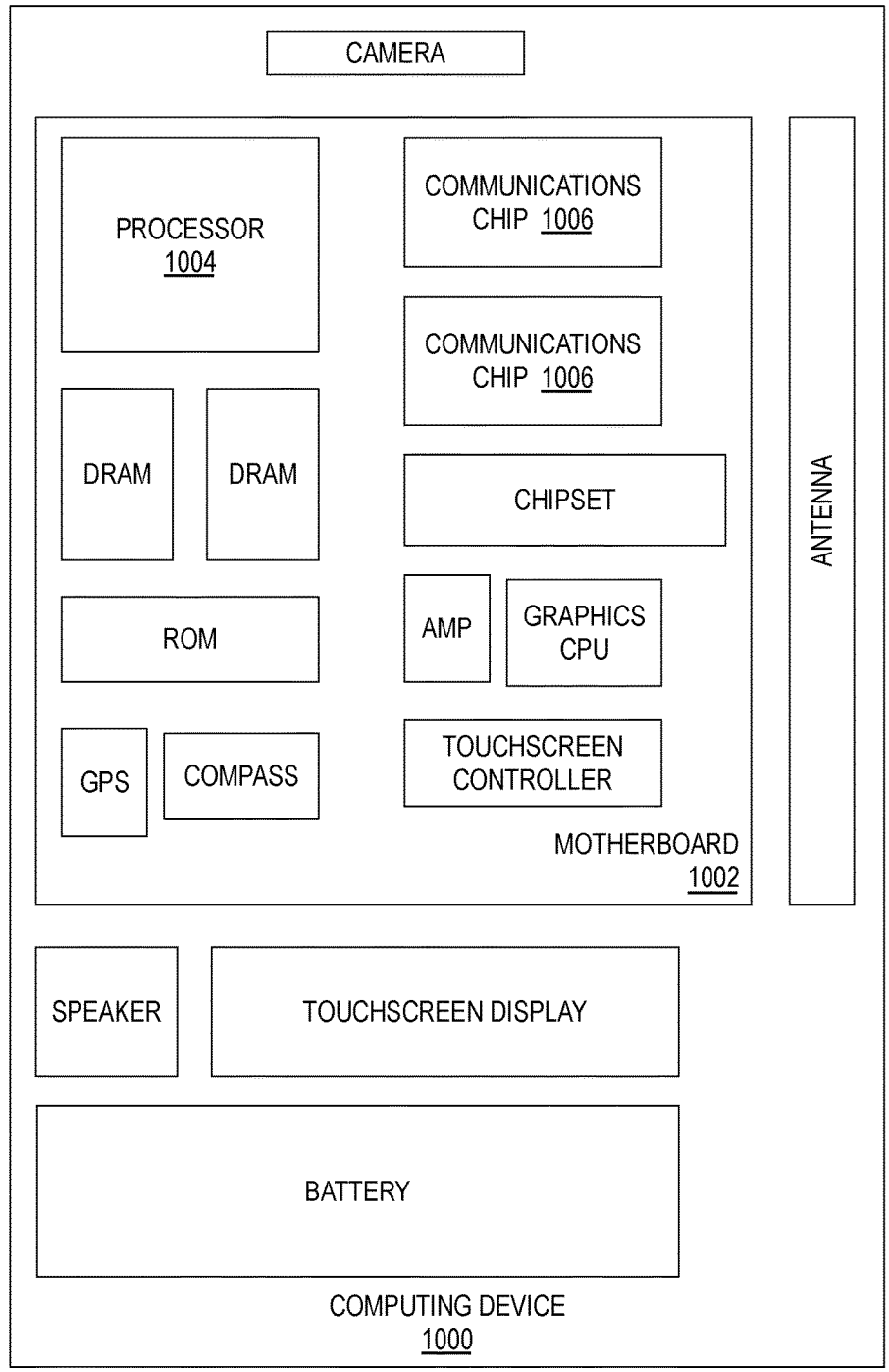
FIG. 10 is a functional block diagram illustrating an electronic computing device, in accordance with an embodiment of the present invention.

FIG. 10 is a functional block diagram of a computing device 1000, arranged in accordance with at least some implementations of the present disclosure. Computing device 1000 may be found inside mobile platform 905 or server machine 906, for example. Device 1000 further includes a motherboard 1002 hosting a number of components, such as, but not limited to, a processor 1004 (e.g., an applications processor), which may further incorporate embedded TFETs including one or more semiconductor oxide, for example in accordance with embodiments described above. Processor 1004 may be physically and/or electrically coupled to motherboard 1002. In some examples, processor 1004 includes an integrated circuit die packaged within the processor 1004. In general, the term "processor" or "microprocessor" may refer to any device or portion of a device that processes electronic data from registers and/or memory to transform that electronic data into other electronic data that may be further stored in registers and/or memory.

In various examples, one or more communication chips 1006 may also be physically and/or electrically coupled to the motherboard 1002. In further implementations, communication chips 1006 may be part of processor 1004. Depending on its applications, computing device 1000 may include other components that may or may not be physically and electrically coupled to motherboard 1002. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1006 may enable wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1006 may implement any of a number of wireless standards or protocols, including but not limited to those described elsewhere herein. As discussed, computing device 1000 may include a plurality of communication chips 1006. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below:

In one or more first embodiments, a heterojunction tunnel field effect transistor (hTFET) disposed over a substrate, the hTFET comprises a channel material separating a p-type material having p-type conductivity from an n-type material having n-type conductivity. The hTFET comprises a gate electrode material and a gate dielectric material separating the gate electrode material from the channel material, wherein at least one of the p-type material, n-type material, or channel material is a metal oxide.

In furtherance of the first embodiments, the p-type material has a type-II or type-III band offset from the channel material.

In furtherance of the first embodiments, the gate dielectric is selected from the group consisting of $HfO_2$, $Al_2O_3$, $HfSiO_x$, $HfAlO_x$, and $TaSiO_x$.

In furtherance of the first embodiments, at least two of the p-type material, n-type material, and channel material are metal oxides.

In furtherance of the first embodiments immediately above, the channel material is an oxide and the gate dielectric is $HfO_2$.

In furtherance of the first embodiments, the channel material is a first oxide and the n-type material comprises the first oxide and a greater amount of a donor impurity than is present in the channel material.

In furtherance of any of the first embodiments, at least one of the p-type material, n-type material, or channel material is a group IV or group III-V semiconductor.

In furtherance of the first embodiments, the channel material comprises Ge and the gate dielectric comprises $HfO_2$ or $HfAlO_x$.

In furtherance of the first embodiments, the p-type material is Ge, GeSn, GaAs, or GaSb, or the n-type material is InAs.

In furtherance of the first embodiments immediately above, the p-type material has a type II or type III band offset from the channel material, and each of the p-type material, n-type material, and channel material is an oxide.

In furtherance of the first embodiments immediately above, the channel material is a first oxide, the n-type material comprises the first oxide and a greater amount of a donor impurity than is present in the channel material, and the p-type material comprises a second oxide, having a different band gap than the first oxide.

In furtherance of the first embodiments immediately above, each of the oxides comprises at least one of Cu, Zn, Sn, Ti, Ni, Ga, In, Sr, Cr, Co, V, and Mo.

In furtherance of the first embodiments immediately above, the second oxide comprises a metal constituent absent from the first oxide.

In furtherance of the first embodiments immediately above, the second oxide comprises at least one of Cu or Ni.

In furtherance of the first embodiments, the n-type material is an oxide comprising at least one of Zn, Ti, or Sn.

In furtherance of the first embodiments immediately above, the p-type material is an oxide comprising at least one of Cu or Ni, the n-type material is an oxide comprising at least one of Zn, Ti, or Sn, and the channel material is an oxide comprising at least one of Zn and Sn.

In furtherance of the first embodiments immediately above, at least one of the n-type material, or channel material further comprises at least one of In, Ga, and Al.

In furtherance of the first embodiments immediately above, the n-type material is GZO, and the channel material is IGZO.

In furtherance of any of the first embodiments, the p-type material is $CuO_x$.

In furtherance of the first embodiments, the oxide is amorphous, the p-type material forms a heterojunction with the channel material that has a type II or type III band offset, the gate dielectric is selected from the group consisting of $HfO_2$, $Al_2O_3$, $HfSiO_x$, $HfAlO_x$, and $TaSiO_x$, and the gate electrode comprises a metal nitride.

In furtherance of the first embodiments, the channel material is Ge or SiGe and the gate dielectric comprises $Al_2O_3$, or the channel material is an oxide comprising at least one of Zn and Sn, and the gate dielectric comprises $HfO_2$.

In furtherance of the first embodiments, the substrate comprises CMOS logic circuitry including a plurality of electrically interconnected MOSFETs.

In one or more second embodiments, a 3D integrated circuit (3DIC), comprises one or more CMOS circuitry levels, each CMOS circuitry level comprising a plurality MOSFETs. The 3DIC further comprises one or more hTFET circuitry levels electrically interconnected to the CMOS circuitry levels, wherein at least one of the hTFET circuitry levels comprises the hTFET in any of the first embodiments.

In one or more third embodiments, a 3D integrated circuit (3DIC), comprises one or more CMOS circuitry levels, each CMOS circuitry level comprising a plurality MOSFETs, and one or more hTFET circuitry levels electrically interconnected to the CMOS circuitry levels. At least one of the hTFET circuitry levels comprises an oxide-based hTFET further comprising a channel material separating a p-type material having p-type conductivity from an n-type material having n-type conductivity, a gate electrode material, and a gate dielectric material separating the gate electrode material from the channel material, wherein at least one of the p-type material, n-type material, or channel material is an oxide.

In one or more third embodiments, the one or more hTFET circuitry levels comprise a plurality of SRAM cells, each of the SRAM cells including a plurality of the oxide-based hTFETs.

In furtherance of the third embodiments, the p-type material has a type II or type III band offset from the channel material, the oxide is a metal oxide comprising a metal selected from the group consisting of Cu, Zn, Sn, Ti and Ni, and gate dielectric is selected from the group consisting of $HfO_2$, $Al_2O_3$, $HfSiO_x$, $HfAlO_x$, and $TaSiO_x$.

In one or more fourth embodiments, a method of fabricating a heterojunction tunnel field effect transistor (hTFET) comprises depositing a first semiconducting oxide of a first conductivity type over a first region of a substrate. The method comprises depositing a second semiconducting oxide over a second region of a substrate, and in contact with the first oxide. The method comprises forming a gate stack over a first portion of the second semiconducting oxide. The method comprises doping a second portion of the second semiconducting oxide unprotected by the gate stack to a second conductivity type, complementary to the first conductivity type. The method comprises forming contact metallization in contact with a gate electrode of the gate stack, the p-type semiconducting oxide, and the n-type semiconducting oxide.

In furtherance of the fourth embodiments, depositing the second semiconducting oxide further comprises blanket depositing the second semiconducting oxide over both the second region of a substrate and the first semiconducting oxide, and planarizing a top surface of the second semiconducting oxide with a top surface of the first semiconducting oxide.

In furtherance of the fourth embodiments, the second conductivity type is n-type and the second oxide comprises at least one of Zn, Ti, and Sn.

In furtherance of the fourth embodiments, the first oxide comprises at least one of Cu and Ni.

In one or more fifth embodiments, a method of fabricating a heterojunction tunnel field effect transistor (hTFET) comprises patterning a device material stack over a substrate. The material stack comprises a channel material layer separating a p-type material layer having p-type conductivity from an n-type material layer having n-type conductivity, and at least one of the channel material layer, p-type material layer, or n-type material layer is a metal oxide. The method comprises depositing a gate stack on at least one sidewall of the material stack, the gate stack including a gate electrode separated from the sidewall of the device material stack by a gate dielectric material. The method comprises forming contact metallization to each of the p-type material layer, n-type material layer, and gate electrode.

In furtherance of the fifth embodiments, each of the channel material layer, p-type material layer, and n-type material layer is an oxide, the n-type oxide comprises at least one of Zn, Ti, and Sn, the p-type oxide comprises at least one of Cu and Ni.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A heterojunction tunnel field effect transistor (hTFET), the hTFET comprising:
   a channel material separating a p-type material having p-type conductivity from an n-type material having n-type conductivity;
   a gate electrode material; and
   a gate dielectric material separating the gate electrode material from the channel material, wherein at least one of the p-type material, n-type material, or channel material comprises a metal and oxygen, wherein the p-type material is Ge, GeSn, GaAs, or GaSb, or the n-type material is InAs, and wherein each of the p-type material, n-type material and channel material is amorphous or polycrystalline.

2. The hTFET of claim 1, wherein the p-type material has a type-II or type-III band offset from the channel material.

3. The hTFET of claim 1, wherein the gate dielectric comprises an oxide or silicate comprising at least one of Hf, Al, or Ta.

4. The hTFET of claim 3, wherein the channel material comprises Ge, and the gate dielectric comprises $HfO_x$ or $HfAlO_x$.

5. The hTFET of claim 1, wherein at least two of the p-type material, n-type material, and channel material are oxides.

6. The hTFET of claim 5, wherein the channel material is an oxide and the gate dielectric comprises Hf.

7. The hTFET of claim 5, wherein the channel material is a first oxide, and the n-type material comprises the first oxide and a greater donor impurity concentration than is present in the channel material.

8. The hTFET of claim 1, wherein the substrate comprises CMOS logic circuitry including a plurality of electrically interconnected MOSFETs.

9. A heterojunction tunnel field effect transistor (hTFET), the hTFET comprising:
a channel material separating a p-type material having p-type conductivity from an n-type material having n-type conductivity;
a gate electrode material; and
a gate dielectric material separating the gate electrode material from the channel material,
wherein the p-type material has a type II or type III band offset from the channel material, and each of the p-type material, n-type material, and channel material comprises a metal and oxygen.

10. The hTFET of claim 9, wherein:
the channel material is a first oxide;
the n-type material comprises the first oxide and a greater concentration of a donor impurity than is present in the channel material; and
the p-type material comprises a second oxide, having a different band gap than the first oxide.

11. The hTFET of claim 10, wherein each of the first and second oxides comprises at least one of Cu, Zn, Sn, Ti, Ni, Ga, In, Sr, Cr, Co, V, and Mo.

12. The hTFET of claim 10, wherein:
the second oxide comprises a metal constituent absent from the first oxide;
the second oxide comprises at least one of Cu or Ni; and
the n-type material is an oxide comprising at least one of Zn, Ti, or Sn.

13. The hTFET of claim 9, wherein:
the p-type material comprises at least one of Cu or Ni;
the n-type material comprises at least one of Zn, Ti, or Sn; and
the channel material comprises at least one of Zn and Sn.

14. The hTFET of claim 13, wherein at least one of the n-type material, or channel material further comprises at least one of In, Ga, and Al.

15. The hTFET of claim 14, wherein:
the n-type material is GZO;
the channel material is IGZO; and
the p-type material is $CuO_x$.

16. A 3D integrated circuit (3DIC), comprising:
one or more CMOS circuitry levels, each CMOS circuitry level comprising a plurality MOSFETs; and
one or more hTFET circuitry levels electrically interconnected to the CMOS circuitry levels, wherein at least one of the hTFET circuitry levels comprises the hTFET recited in claim 9.

17. A 3D integrated circuit (3DIC), comprising:
one or more CMOS circuitry levels, each CMOS circuitry level comprising a plurality MOSFETs; and
one or more hTFET circuitry levels electrically interconnected to the CMOS circuitry levels, wherein at least one of the hTFET circuitry levels comprises a heterojunction tunnel field effect transistor (hTFET), the hTFET comprising: a channel material separating a p-type material having p-type conductivity from an n-type material having n-type conductivity; a gate electrode material; and a gate dielectric material separating the gate electrode material from the channel material, wherein at least one of the p-type material, n-type material, or channel material comprises a metal and oxygen, wherein each of the p-type material, n-type material, or channel material is amorphous.

18. The hTFET of claim 17, wherein:
the channel material is Ge or SiGe and the gate dielectric comprises Al; or
the channel material is an oxide comprising at least one of Zn and Sn, and the gate dielectric comprises Hf.

19. A 3D integrated circuit (3DIC), comprising:
one or more CMOS circuitry levels, each CMOS circuitry level comprising a plurality MOSFETs; and
one or more heterojunction tunnel field effect transistor (hTFET) circuitry levels electrically interconnected to the CMOS circuitry levels, wherein at least one of the hTFET circuitry levels comprises an hTFET comprising:
a channel material separating a p-type material having p-type conductivity from an n-type material having n-type conductivity;
a gate electrode material; and
a gate dielectric material separating the gate electrode material from the channel material, wherein each of the p-type material, n-type material, or channel material comprises a metal and oxygen.

* * * * *